(12) United States Patent
Uhara

(10) Patent No.: US 6,828,390 B2
(45) Date of Patent: Dec. 7, 2004

(54) POLYIMIDE SUBSTRATES HAVING AN INTERPENETRATING NETWORK MORPHOLOGY AND METHODS RELATING THERETO

(75) Inventor: Kenji Uhara, Nagoya Aich (JP)

(73) Assignee: E.I. du Pont de Nemours and Company, Wilmington, DE (US)

( * ) Notice: Subject to any disclaimer, the term of this patent is extended or adjusted under 35 U.S.C. 154(b) by 0 days.

(21) Appl. No.: 10/331,234

(22) Filed: Dec. 30, 2002

(65) Prior Publication Data

US 2003/0236359 A1 Dec. 25, 2003

Related U.S. Application Data

(60) Provisional application No. 60/390,923, filed on Jun. 24, 2002.

(51) Int. Cl.[7] .............................................. C08L 79/08

(52) U.S. Cl. ...................... 525/436; 525/432

(58) Field of Search ................. 525/436, 432

(56) References Cited

U.S. PATENT DOCUMENTS

| | | | |
|---|---|---|---|
| 5,081,229 A | | 1/1992 | Akahori et al. |
| 5,098,961 A | | 3/1992 | Pater |
| 5,149,746 A | * | 9/1992 | Pater ......................... 525/422 |
| 5,159,029 A | | 10/1992 | Pater et al. |
| 5,306,784 A | | 4/1994 | Pater |
| 5,492,979 A | | 2/1996 | Pater |
| 5,939,498 A | * | 8/1999 | Sutton, Jr. et al. .......... 525/432 |
| 6,081,229 A | | 6/2000 | Soliman et al. |

FOREIGN PATENT DOCUMENTS

JP 62270622 * 11/1987

* cited by examiner

Primary Examiner—Ana Woodward

(57) ABSTRACT

A high modulus, dimensionally stable film formed via an interpenetrating polyimide network of two polyimide structures, interlocked and bonded on a molecular level. The polyimide components are made from a dianhydride and a diamine. The dianhydrides used are tetravalent aromatic structures represented by

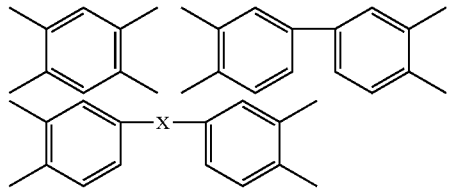

where X is a divalent organic group selected from among —CO—, —O—, —S—, —SO$_2$—, —CH$_2$—, —C(CH$_3$)$_2$—, and —C(CF$_3$)$_2$— and diamines used are divalent aromatic structure represented by

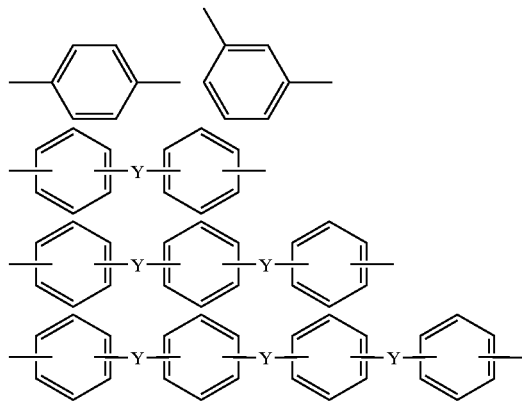

wherein Y is a divalent organic group selected from the group consisting of —CO—, —O—, —S—, —SO$_2$—, —CH$_2$—, —C(CH$_3$)$_2$—, and —C(CF$_3$)$_2$—. The end capping agent is a carboxylic anhydride or a silylating agent. The second polyimide is polymerized in the presence of the first polymer thus forming a single phase system.

12 Claims, No Drawings

POLYIMIDE SUBSTRATES HAVING AN INTERPENETRATING NETWORK MORPHOLOGY AND METHODS RELATING THERETO

REFERENCE TO RELATED APPLICATION

This Application claims benefit of Provisional Application 60/390,923 filed Jun. 24, 2002.

FIELD OF THE INVENTION

The present invention relates generally to polyimide substrates for use relating to flexible printed circuits, tape-automated bonding (TAB) tapes, metal interconnectors for integrated circuits and other similar-type electronics applications. More specifically, the polyimide substrates of the present invention have advantageous dimensional stability due, at least in part, to an interpenetrating polymer network morphology which inhibits large-scale phase separation.

BACKGROUND OF THE INVENTION

U.S. Pat. No. 5,129,029 to Uemiya, et al. teaches polyimide compositions having a combination of a thermosetting polyimide and a thermoplastic polyimide.

SUMMARY OF THE INVENTION

The compositions and methods of the present invention are directed to a high modulus interpenetrating network polyimide film of at least two polyimide components. The interlocked polyimide components can be synthesized by polymerizing a first polyamic acid precursor material to a viscosity of less than 1000, 500, 400, 300, 250, 200, 150, 125, 100, 75, or 50 centipoise and then end-capping the first precursor material. The end capping agents used are either a carboxylic anhydride or a silylating agent.

A second polyamic acid precursor material can then be intermixed with the first precursor material. The end capping of the first material largely inhibits further polymerization and thereby allows preferential polymerization of the second polyamic acid in and around the first polymerized material, thereby forming the interpenetrating network. A second end capping can optionally be used to control the amount of polymerization of the second precursor material.

Useful dianhydrides for use in the present invention include tetravalent aromatic structures represented by

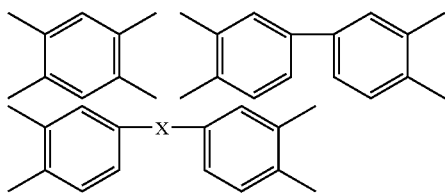

where X is a divalent organic group selected from among —CO—, —O—, —S—, —SO$_2$—, —CH$_2$—, —C(CH$_3$)$_2$—, and —C(CF$_3$)$_2$— and useful diamine are divalent aromatic structure represented by

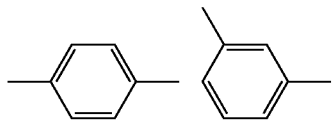

-continued

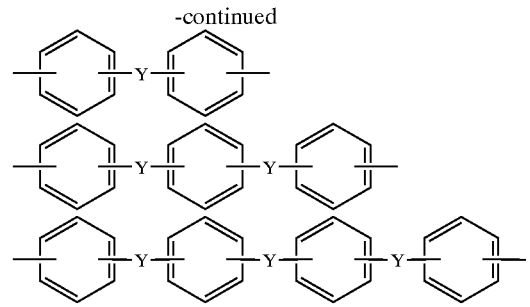

where Y is a divalent organic group selected from the group consisting of —CO—, —O—, —S—, —SO$_2$—, —CH$_2$—, —C(CH$_3$)$_2$—, and —C(CF$_3$)$_2$—.

When the second polyimide is polymerized in the presence of the first polymer, the two polymers will generally exhibit less phase separation relative to a simple melt blending of one another. Such interpenetrated polyimide compositions of the present invention are ideally suited as metal interconnect circuit board materials for flexible printed circuits, tape-automated bonding (TAB) tapes, metal interconnectors for integrated circuits and other similar-type electronics applications.

DETAILED DESCRIPTION OF THE PREFERRED EMBODIMENT(S)

In one embodiment of the present invention, an interpenetrating polyimide network (IPN) film is formed, comprising an interpenetrating composition where a first polyimide and a second polyimide are physically interlocked and thereby bonded together.

In one embodiment, the interpenetrating polyimide has repeating units of structural formulas (I) and (II) below

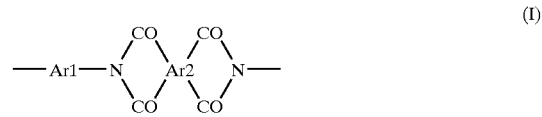

(I)

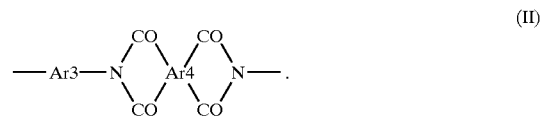

(II)

where Ar2 and Ar4 are tetravalent aromatic groups selected from among the following structures

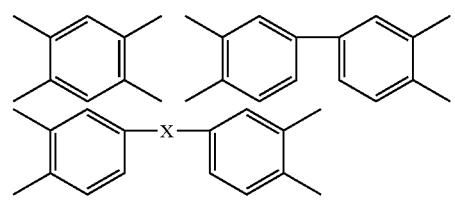

wherein X is a divalent organic group selected from among —CO—, —O—, —S—, —SO$_2$—, —CH$_2$—, —C(CH$_3$)$_2$—, —C(CF$_3$)$_2$. and Ar1 and Ar3 are divalent aromatic groups selected from among the following structures

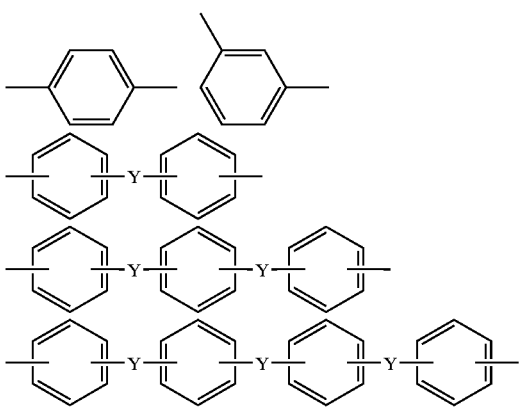

wherein Y is a divalent organic group selected from among —CO—, —O—, —S—, —SO$_2$—, —CH$_2$—, —C(CH$_3$)$_2$—, —C(CF$_3$)$_2$—.

As used herein, the term "physically interlocked and bonded," refers to a state in which the molecular weight distribution of the polyamic acid, or polyimide formed therefrom, does not have a readily apparent single peak but rather tends to exhibit two or more molecular weight peaks. It also refers to a state in which phase separation of the two polyimides does not substantially occur in either the polyamic acid state or the polyimide film state. Since there is no solvent in the polyimide state, determination of the molecular weight distribution must generally be carried out in the polyamic acid state. For a polyimide, phase-separation can often be observed as haze, evaluated as a loss in transparency of light through the film. Phase separation can also be identified by an increase of about 10% or more, in water absorption due to void formation after the film has been stretched to about 20% of its original dimension.

As used herein, the term "reaction-inert" refers to a state in which a first polyamic acid, when a second diamine and a second dianhydride is added to it, will not react significantly to the second diamine or second dianhydride. In other words, the second diamine and the second dianhydride are able to form a distinct polymer chain without continuing the polymerization of the first polyamic acid chains.

As used herein, the term "substantially equimolar" means that the number of moles of the diamine dianhydride are about equal. For example, if a monovalent end capping group like acetic anhydride is used to make the first polyamic acid reaction inert, one would need twice as many moles of acetic anhydride as the dianhydride used to make the first polyamic acid. End-capping agents like carboxylic anhydride or silylating agents may be added in an amount within the range of 0.001 to 2%, based on the solids of the first polyamic acid. A more advantageous way of making the first polyamic acid reaction inert is to add in excess even more moles of end-capping agent.

In one embodiment, a polyamic acid interpenetrating solution can be manufactured by steps, (a) to (e), in the order described below.

(a) substantially equimolar amounts of a first diamine and a first dianhydride are reacted to form a first polyamic acid, (b) the first polyamic acid is made to be reaction inert by adding the appropriate amount of end-capping agent.

(c) a second diamine and a second dianhydride are added to the first polyamic acid. The second diamine and second dianhydride are polymerized in the presence of the first polyamic acid, which thus forms an interpenetrating polyamic acid network.

Regarding steps (a) and (b), it should be noted that generally speaking, when blending two polyamic acids that have been separately prepared, then mixed, phase-separation tends to occur. However, in accordance with the present invention, the first polyamic acid is polymerized only to a level where it can still be interdispersed within the second polyamic acid solution, and upon reaching such a level of polymerization, further reaction is inhibited by end-capping. Hence, the second polymeric material can polymerize in and around the first. The resulting bonding effect, while perhaps not fully understood, is believed to occur because the two polyamic acids form a structure that is mutually, physically 'interpenetrating' and chemically bonded via intermolecular forces.

In step (c), it is preferable for the reaction between the second diamine and the second dianhydride to be substantially non-equimolar. A second polyamic acid in which the components are non-equimolar allows for a 'plasticizing' effect to occur. The plasticizing effect generally lowers the viscosity of the network during extrusion even though a polymer solids content may be high. When viscosity is lower, the polymer extrusion rate can be higher, making it possible to increase the overall film production rate. A second reason for the second polyamic acid to be non-equimolar is to allow for end capping groups to be in excess. A film formed in this way will have superior good bonding strength to metals and the like. As such, the total diamine and acid dianhydride in the interpenetrating polyimide film is actually non-equimolar on the molecular level.

Suitable examples of diamines for the first polyamic acid and the second polyamic acid, which may be the same or different than each other, include diamines like 3,4-diaminodiphenyl ether (3,4'-ODA), 4,4'-diaminodiphenyl ether and phenylenediamine (PPD), their isomers, and mixtures thereof.

As discussed earlier, it is advantageous to add the monofunctional components, end capping groups, (e.g., an acid monoanhydride such as acetic anhydride, and a monoamine is a monofunctional component) as starting materials used to produce the first polyamic acid. It may also be desirable to add a trifunctional acid (e.g., trimellitic anhydride) as a starting material for the second polyamic acid.

Suitable examples of dianhydrides for the first polyamic acid and the second polyamic acid, which may be the same or different than each other, includes pyromellitic dianhydride, 3,3',4,4'-biphenyltetracarboxylic dianhydride, benzophenonetetracarboxylic dianhydride and isomers and mixtures thereof.

Preferred combinations include a phenylenediamine (PPD) or a diaminodiphenyl ether (ODA) as the diamine, in combination with pyromellitic dianhydride (PMDA) and biphenyltetracarboxylic dianhydride (BPDA) as the dianhydride. More preferably, the diaminodiphenyl ether is 3,4'-diaminodiphenyl ether or 4,4'-diaminodiphenyl ether and the phenylenediamine is p-phenylenediamine.

Steps (a), (b), and (c) are carried out at a temperature range from −50 to 100° C. Mixing at a temperature above 100° C. may cause the first polyamic acid to react with the second polyamic acid to a high degree, thus forming a gel. At temperatures below −50° C. the polymer system mixed will have too high a viscosity resulting in overall poor mechanical mixing. Temperatures between −20 to 60° C. are preferred, even more preferably is a mixing temperature between −10 to 50° C., and most preferably is 0 to 40° C.

Steps (a), (b), and (c) are carried out at a polymer solids concentration within a range of preferably 5 to 50% by weight. At a polymer solids concentration less than 5 wt. %, the production efficiency of the film itself will be poor. At more than 50 wt. %, the first and second polyamic acids will react with one another to an excessive degree. Also, viscosity of the network will increase causing unwanted effects like gelation or the need for long mixing time.

Any suitable weight ratio (on a solids basis) between the first polyamic acids and the second polyamic acid may be selected. However, a weight ratio of at least 1.0/1.0 is preferred so long as the second polyamic acid is non-equimolar. Weight ratios between 3 to 90 (where the first polyamic acid greatly outweighs the second) is more preferred. At a weight ratio less than 1.0/1.0, the polyimide film becomes brittle.

The reactor vessel used in steps (a), (b), and (c) may be a polymerization reactor or an extrusion pipe feeder so long as there is adequate mixing. The use of a polymerization reaction vessel with stirrer is preferred.

After the interpenetrating polyamic network is formed, conversion chemicals must be added.

(d) add to the polyamic acid interpenetrating network, a dehydrating agent and a polymerization catalyst in order to effectuate conversion of the polyamic acid network to an interpenetrating polyimide.

(e) cast, or extrude, the polyamic acid interpenetrating network, with conversion chemicals, onto a smooth surface to form a gel film.

(f) heat the gel film at a temperature of 200 to 500° C. to chemically react the system, via imidization and dehydration, to an interpenetrating network polyimide film.

In one specific embodiment of the invention is an interpenetrating polyimide made of pyromellitic dianhydride, p-phenylenediamine and 3,4'-diaminodiphenyl ether. This polyimide is manufactured by using pyromellitic dianhydride as the dianhydride and p-phenylenediamine and 3,4'-diaminodiphenyl ether as the diamine. First, 3,4'-diaminodiphenyl ether is dissolved in an organic solvent like dimethylacetamide. Pyromellitic dianhydride is added to the resulting solution, and the first polyamic acid reaction is carried out to completion. The further addition of an end-capping agent or an imidizing agent ensures the effective formation of an interpenetrating state. The imidizing agent used for this purpose is preferably one having about the reactivity of a dehydrating agent. Here, the end capping agent is typically a dicarboxylic anhydride or a silylating agent. The end-capping agent added preferably in an amount ranging from 0.001 to 2.0%, based on the solids content of the polymer in solution. Preferred dicarboxylic anhydrides include acetic anhydride and phthalic anhydride. Preferred examples of silylating agents include non-halogenated hexamethyldisilazane, N,O-(bistrimethylsilyl)acetamide and N,N-bis(trimethylsilyl) urea. Substantially equimolar amounts of the diamine and dianhydride is used when making the first polyamic acid.

Next, dimethylacetamide is added to the system along with p-phenylenediamine and pyromellitic dianhydride. The second polyamic acid is polymerized. The diamine and dianhydride are non-equimolar. In the preparation of the two polyamic acids, first and second, the endpoint of addition which would make respective solutions substantially equimolar is possible if desired so long as viscosity and solids concentration are controlled.

Preferred organic solvents are solvents that are non-reactive with the respective components. The organic solvents should dissolve all of the components and also dissolves the polyamic acid or a copolymeric polyamic acid. Examples of organic solvents include N,N-dimethylacetamide, N,N-diethylacetamide, N,N-dimethylformamide, N,N-diethylformamide and N-methyl-2-pyrrolidone. Any one of these solvents, or a mixture thereof, may be used. In some cases, concomitant use of a poor solvent, such as benzene, is possible.

During the manufacturing of an interpenetrating polyimide film, the interpenetrating polyamic acid solution is pressurized with an extruder or gear pump. The interpenetrating polyamic acid solution is passed through a filter to remove any foreign matter, solids, and high-viscosity impurities that are present in the starting materials (or materials formed during polymerization). The filtered interpenetrating polyamic acid solution passes next through a film-forming die or a coating head, and is extruded in the form of a film. Extrusion takes place on a surface of a rotating or laterally moving support. The interpenetrating polyamic acid is heated to give an interpenetrating polyamic acid-polyimide gel film. In the gel film, some of the polymer has imidized while some is still in the acid state. The gel film is self-supporting. When the gel film reaches a state where it is strong enough physically to be peeled, it removed from the support and introduced into a drier where it is heated. In the drier the remaining solvents, including water from the condensation reaction, are removed and full imidization of the interpenetrating polyamic acid is complete. Thus, a fully imidized, interpenetrating polyimide is formed.

Generally, imidization of interpenetrating polyamic acids may be carried out by a thermal conversion process in which heating alone is used. This is in contrast to a chemical conversion process where imidizing agents are added to the acid or the acid is immersed in a bath containing imidizing agents. But, if the final interpenetrating polyimide film is used as a metal interconnect circuit substrate, a chemical conversion process is preferable over a thermal conversion process.

Generally, imidizing agents are tertiary amines that promote imidization. The general class of imidizing agent also includes dehydrating agents that absorb the moisture formed during a condensation, imidization reaction. Typically, a substantially equimolar, or slight excess, of tertiary amine is added to the interpenetrating polyamic acid. The amount added is about two moles, or higher, dehydrating agent per mole of interpenetrating polyamic acid. The amount may however, be adjusted to achieve the desired peel point from the supporting surface. Imidizing agents may be added at any time. They may be added during the polymerization of the interpenetrating polyamic acid, or when the interpenetrating polyamic acid solution reaches the film-forming die. To prevent imidization from occurring during delivery of the interpenetrating polyamic acid, the imidizing agent is preferably added into an inline mixer at some point after polymerization, but before casting. Most preferably, just before casting. Preferable tertiary amines are pyridine or β-picoline. Other tertiary amines such as α-picoline, 4-methylpyridine, isoquinoline or triethylamine may also be used. The amount used is adjusted according to the activity level of the particular tertiary amine selected.

Acetic anhydride is most commonly used as the dehydrating agent. Other dehydrating agents may also be used such as propionic anhydride, butyric anhydride, benzoic acid and formic anhydride.

Interpenetrating polyimides are manufactured in the same way as non-interpenetrating polyimides. The interpenetrating polyamic acid-polyimide gel film is generally held at both edges with tenter clips and passed through a drier, or tenter frame, by the forward movement of the tenter clips.

Inside the tenter frame, the film is heated and imidized. Drying and imidization is carried out at a temperature of between 200° and 500° C. Drying and imidization temperatures may be the same throughout processing, however increasing the temperature in a stepwise manner is preferred. Typically, low temperatures are used at the stage where a large amount of solvent is removed and high temperatures are used to accelerate the imidization reaction. In the tenter frame, the partially cured film is stretched, or then relaxed, by increasing and decreasing the distance between the tenter clips at either edge of the film.

When comparing interpenetrating polyimide films made by chemical conversion versus thermal conversion, a chemically converted interpenetrating polyimide has higher elastic modulus, lower thermal expansion and stronger bonding to metal. Ideally, the interpenetrating polyimides of the present invention have an elastic modulus of at least 5 GPa, a thermal expansion coefficient of from 10 to 20 ppm/° C., and a water absorption factor of not more than 2%, most preferably not more than 1%. Bonding properties to metal are preferably such that the film retains good bonding strength even after it has passed through a water washing step. The method of evaluation involves immersing the film in water, followed by a drying step. Here, the contact angle of water on the surface of the dried film is preferably not more than 60 degrees.

A interpenetrating polyimide film may also be subjected to electrical treatment to further enhance its bonding characteristics to metal. Well known methods of electrical treatment include corona discharge treatment, vacuum plasma treatment, and gas plasma treatment.

EXAMPLES

Examples 1–6 and Comparative Examples 1–6 illustrate how the properties obtained by an interpenetrating polyimide differs from the polyimides of the prior art. The first polymer was made from either 3,4'-diaminodiphenyl ether (3,4'-ODA) or 4,4'-diaminodiphenyl ether (4,4'-ODA) along with pyromellitic dianhydride (PMDA) as the dianhydride, and the second polymer was made from either 3,4'-diaminodiphenyl ether (3,4'-ODA) or p-phenylenediamine (PPD) as the diamine, and 3,3',4,4'-biphenyltetracarboxylic dianhydride (BPDA) or PMDA as the dianhydride. See Tables 1 and 2.

Examples 7 and 8, as well as Comparative Examples 7–9, illustrate how the interpenetrating polyimides of the present invention, those using p-phenylenediamine (PPD) and pyromellitic dianhydride (PMDA) as the first polymer, and 4,4'-diaminodiphenyl ether (4,4'-ODA) as the diamine and pyromellitic dianhydride (PMDA) and 3,3',4,4'-biphenyltetracarboxylic dianhydride (BPDA) as the dianhydrides for the second polymer, differ from those film made using blending and block copolymerization. See Table 3.

All of the examples below were made with dimethylacetamide (DMAC) as the solvent. The examples below are not intended to limit the invention. The properties of the films produced are described in TABLES 1, 2 and 3.

Definitions of Film Properties
(1) Elastic Modulus

The elastic modulus was determined in accordance with JIS K7113 from the slope of the first rise in the tension-strain curve obtained at a test rate of 300 mm/min using a Tensilon tensile tester manufactured by Orientech Inc.

(2) Thermal Expansion Coefficient (CTE)

The temperature of a sample was increased at a rate of 10° C. then decreased at a rate of 5° C./min using a TMA-50 thermo-mechanical analyzer manufactured by Shimadzu Corporation. The dimensional change in the sample from 50° C. to 200° C. at the time of the second rise or fall in the temperature was used to determine the thermal expansion coefficient.

(3) Bond Strength
  A. Initial:

A film/adhesive/copper foil laminate (referred to hereinafter as "FC laminate") was prepared by laminating a sample of surface-treated film with copper foil (3EC, produced by Mitsui Mining and Smelting Co., Ltd.; film thickness, 35 μm) using an acrylic adhesive (Pyralux, produced by Du Pont K.K.), and curing the adhesive at 185° C. for 1 hour. The resulting FC laminate was cut into strips 10 mm wide and 30 cm long. The strips were subjected to a 900 peel test using a tensile tester (UTA-300 KN Tensilon universal testing machine, manufactured by A&D K.K.) at a peel test speed of 50 mm/min. Each of the values given in the table is the average of five measurements.

B. After Water Treatment:

A sample of surface-treated film was immersed in water for one day, then dried in a 110° C. oven. The procedure described above under "Initial Bond Strength" was carried out using the resulting dried sample.

(4) Warping of Metal Laminate

A polyimide-base adhesive was coated onto the polyimide film, and copper foil was laminated thereon at a temperature of 250° C. The adhesive was then cured by raising the temperature to a maximum of 300° C. The resulting metal laminate was cut to a sample size of 35×120 mm. The samples were held for 24 hours at 25° C. and 60% relative humidity, following which the extent of warp in each sample was measured. Measurement consisted of placing the sample on a flat sheet of glass, and measuring and averaging the height of the four corners. The extent of warping was rated as indicated below. A rating of "large" means that use of the sample as a metal interconnect circuit board would result in handling problems during conveyance in subsequent operations.

| Small: | Less than 1 mm of warp |
| Medium: | At least 1 but less than 3 mm of warp |
| Large: | At least 3 mm of warp |

(5) Extrudability

A prepared polyamic acid solution in which polymerization had reached completion was placed in a stainless steel cylindrical container that could be fitted at the bottom with a filter. A pressure of 202 KPa was applied using dry nitrogen, and the weight of polyamic acid solution discharged per 10 minutes was measured. Extrudability was rated as indicated below.

The filter used was a 14 μm cutoff sintered metal fiber filter (FSS-06D, Leafdisk*, manufactured by Nippon Seisen Co., Ltd.).

| Good: | At least 50 g |
| Fair: | At least 10 g but less than 50 g |
| Poor: | Less than 10 g |

(6) Viscosity

The viscosity of the polymer immediately after interpenetrating polymerization was measured with a Brookfield rotary viscometer (TVB-20LT, manufactured by Tokimec Inc.) at 20° C.

Example 1

A 2,000 cc glass flask was charged with 1,150 ml of dimethylacetamide solvent. Next was charged 198 g of 3,4'-diaminodiphenyl ether, the powder dissolved. Then, 218 g of pyromellitic dianhydride was added as a powder and dissolved. The flask contents were stirred at room temperature for about one hour, ultimately giving a polyamic acid (C1). The tetracarboxylic dianhydride component and the diamine component were about 100 mol % stoichiometric in C1.

To C1 was added, an additional 21.5 g of 3,4'-diaminodiphenyl ether and 24.7 g of pyromellitic dianhydride (C2). The weight solids percent was increased to 30 wt %. The interpenetrating network polyamic acid solution C1/C2 is shown in Table 1 as EXAMPLE 1. Since more dianhydride was added than diamine in C2, the final polyamic acid of EXAMPLE 1, C1/C2 had a stoichiometric excess of the acid component. The viscosity and extrudability of EXAMPLE 1 were evaluated.

Thirty grams of this polyamic acid solution was stirred at 0° C. for about one hour, then mixed with dimethylacetamide (19.1 ml), acetic anhydride (5.4 ml) and β-picoline (5.4 ml) to give a mixed solution. The mixed solution was coated as a thin film onto a glass plate using a K Control Coater (manufactured by RK Print-Coat Instruments, Ltd.), then heated for about 4 minutes in an oven at 150° C. A self-supporting, interpenetrating polyamic acid-polyimide interpenetrating gel film, was formed. The film was subsequently peeled from the glass plate.

The gel film was set in a metal holding frame equipped with numerous pins and heated for 30 minutes. The temperature was raised from 250° C. to 330° C., and then heated for about 5 minutes at 400° C. EXAMPLE 1 was thus converted to a interpenetrating network polyimide film having a thickness of about 25 μm. The measured properties of the polyimide interpenetrating film are given in Table 1 as EXAMPLE 1.

The resulting polyimide interpenetrating film was plasma treated. Plasma treatment was carried out by glow discharge at a pressure of $10^{-1}$ Torr, in an argon atmosphere, and at a discharge output of 1,000 W·min/m².

Example 2

The same procedure was followed as EXAMPLE 1. Except, 1,290 ml of dimethylacetamide was placed in a 2,000 cc glass flask, 198 g of 4,4'-diaminodiphenyl ether and 218 g of pyromellitic dianhydride were used as the starting materials for polyamic acid C1. Next 33.1 g of p-phenylenediamine and 70.9 g of pyromellitic dianhydride were used as the starting materials for polyamic acid C2. The measured properties of the resulting interpenetrating polyamic acid C1/C2 and interpenetrating polyimide film are shown in Table 1.

Example 3

The same procedure was followed as EXAMPLE 1. Except, 1,290 ml of dimethylacetamide was placed in a 2,000 cc glass flask, 198 g of 3,4'-diaminodiphenyl ether and 218 g of pyromellitic dianhydride were used as the starting materials for polyamic acid C1. Next, 33.1 g of p-phenylenediamine and 70.9 g of pyromellitic dianhydride were used as the starting materials for polyamic acid C2. The measured properties of the resulting interpenetrating polyamic acid C1/C2 and interpenetrating polyimide are shown in Table 1.

Examples 4 and 5

The same procedure was followed as EXAMPLE 2. Except, 1,290 ml of dimethylacetamide was placed in a 2,000 cc glass flask, 198 g of 3,4'-diaminodiphenyl ether and 218 g of pyromellitic dianhydride were used as the starting materials for polyamic acid C1. Next, 26.7 g of p-phenylenediamine and 77.3 g of biphenyltetracarboxylic dianhydride were used as the starting materials for polyamic acid C2. The measured properties of the resulting interpenetrating polyamic acid C1/C2 and interpenetrating polyimide are shown in Table 1.

Example 6

A 2,000 cc glass flask was charged with 1,290 ml of dimethylacetamide, following which 198 g of 3,4'-diaminodiphenyl ether and 217.8 g of pyromellitic dianhydride were successively added and the flask contents were stirred at room temperature. Next, 0.2 g of acetic anhydride was added, and the mixture was stirred again for about one hour, ultimately giving a polyamic acid (C1) in which the tetracarboxylic dianhydride component and the diamine component were about 100 mol % stoichiometric. Next, 26.7 g of p-phenylenediamine and 77.2 g of biphenyltetracarboxylic dianhydride were successively added, forming a solution in which the concentration of polyamic acid having the composition shown in Table 1 was 30% by weight.

The solution thus obtained was used to carry out the same subsequent procedure as in EXAMPLE 1. The measured properties of the resulting polyimide interpenetrating film are shown in Table 1.

Example 7

4.33 g of p-phenylenediamine (PPD) were charged into a 500-ml separable flask equipped with a DC stirrer. 30 g of dimethylacetamide (DMAc) were added to dissolve the PPD. The solution was stirred at 5° to 10° C. in a dry nitrogen atmosphere.

8.72 g of pyromellitic dianhydride (PMDA) was added to a 100 ml-eggplant type flask and then was added in solid form to the PPD solution. The PMDA attached to the inner wall surface of the 100-ml eggplant type flask and was dissolved in an additional 10 g of DMAc. The mixture was stirred for half an hour. Then, 0.163 g of acetic anhydride was added. The mixture was stirred for half an hour. An end-capped, first polyamic acid was obtained.

Next, 32.038 g of 4,4-ODA was added to the first polyamic acid. Next, 285 g of DMAc was added to assist dissolving of the ODA. The mixture was stirred at from 50° 10° C. in a dry nitrogen atmosphere.

Next, 23.993 g of PMDA and 14.610 g of 3,3',4,4'-biphenyltetracarboxylic dianhydride (BPDA) was added to a 100-ml eggplant type flask. These dianhydrides were then added, in solid form, to the first polyamic acid. The PMDA and BPDA attached to the inner wall surface and were dissolved with an additional log of DMAc. The mixture was stirred for one hour thereby obtain an interpenetrating polyamic acid polymer.

The interpenetrating polyamic acid polymer was further stirred and then aged at 30° C., in a dry nitrogen atmosphere for one day to obtain an aged interpenetrating polyamic acid polymer.

30 g of the interpenetrating polyamic acid polymer, 12.7 ml of DMAc, 3.6 ml of acetic anhydride and 3.6 ml of beta-picoline were stirred together at −15° C. A portion of the resultant polyamic acid polymer containing chemical conversion additives was cast onto a glass plate to generate a uniform interpenetrating polyamic acid-polyimide gel film over 4 minutes at 150° C. The gel film was heat again for 20 minutes at 300° C. and again for 5 minutes at 400° C. to obtain an interpenetrating polyimide film. The thickness of the film was 37.5 micrometers. Results are shown in Table 3.

The same procedure was performed using a portion of the aged interpenetrating polyamic acid to form an aged interpenetrating polyimide film. The thickness of the aged interpenetrating polyimide film is also 37.5 micrometer and results are shown in Table 3.

Example 8

EXAMPLE 8 was prepared in accordance with EXAMPLE 7 except that the second polyamic acid was also end-capped with acetic anhydride. After addition of the PMDA and BPDA, 0.163 g of acetic anhydride was added to the mixture and the mixture was stirred for half an hour. A portion of the interpenetrating polyamic acid formed was set aside and aged as in EXAMPLE 7. Results are shown in Table 3.

Comparative Example 1

In a 2 liter flask was charged with 1,036 ml of dimethylacetamide, following which 198 g of 3,4'-diaminodiphenyl ether was added to the dimethylacetamide and dissolved, then 218 g of pyromellitic dianhydride was added. The flask contents were stirred at room temperature for about one hour, ultimately giving a 30 wt % solution of a polyamic acid having the composition shown in Table 2. The tetracarboxylic acid dianhydride component and the diamine component were about 100 mol % stoichiometric.

Using the polyamic acid thus prepared (a C1 formulation at 30 weight % solids), the viscosity and extrudability were evaluated in the same way as in EXAMPLE 1. The viscosity was so high that it exceeded the measurement range (greater than 2,000 Pa·s).

Using this polyamic acid solution and following the same procedure as in EXAMPLE 1, an imidization catalyst was added, after which the gel film obtained was set on a frame, dried and heated to give a polyimide film. The measured properties of the polyimide film are given in Table 2.

Comparative Example 2

A 2,000 cc glass flask was charged with 1,026 ml of dimethylacetamide, following which 194 g of 3,4'-diaminodiphenyl ether was added to the dimethylacetamide and dissolved. Then, 218 g of pyromellitic dianhydride was added. The flask contents were stirred at room temperature for about one hour, ultimately giving a 30 wt % solution of a polyamic acid having the composition shown in Table 2. The polyamic acid had a stoichiometric excess of the dianhydride component.

Using the polyamic acid thus prepared, the viscosity and extrudability were evaluated in the same way as in EXAMPLE 1. An imidization catalyst was added, after which the gel film obtained was set on a frame, dried and heated. The film fractured during cooling after the heating step. The fragments of fractured film were very brittle. The measured properties obtained in this example are shown in Table 2.

Comparative Examples 3 and 4

These comparative examples represent a 'blend' polyimerization technique. In a 2,000 cc glass flask was charged 1,000 ml of dimethylacetamide and 198 g of 4,4'-diaminodiphenyl ether. Next, 218 g of pyromellitic dianhydride was added. The flask contents were stirred at room temperature for about one hour, ultimately giving a solution of a two-component polyamic acid (C1) having the composition shown in Table 2 in which the tetracarboxylic dianhydride component and the diamine component were about 100 mol % stoichiometric.

In a separate flask was charged 290 ml of dimethylacetamide and 34 g of p-phenylenediamine. Next, 70 g of pyromellitic dianhydride was added. The flask contents were stirred at room temperature for about one hour, ultimately giving a solution of a two-component polyamic acid (C3). The tetracarboxylic dianhydride component and the diamine component were about 100 mol % stoichiometric.

Next, the entire amount of the C3 in the second flask was added to the entire amount of C1 in the first flask. The mixture was stirred at 0° C. for about one hour. The resulting polyamic acid solution C1/C3 was thus a blend. The blend was treated by the same method as EXAMPLE 1. The blend polyimide film had a thickness of about 25 $\mu$m. The polyimide blend film was cloudy, indicating that phase separation had occurred. Results are shown in Table 2.

Comparative Example 5

This comparative example represents a 'block' polyimerization technique. A 2,000 cc glass flask was charged with 1,288 ml of dimethylacetamide, following which 198 g of 4,4'-diaminodiphenyl ether and 216 g of pyromellitic dianhydride were added to the dimethylacetamide and dissolved. Next, 32.9 g of p-phenylenediamine and 70.5 g of pyromellitic dianhydride were successively added, following which the flask contents were stirred at room temperature for about one hour, ultimately giving a 30 wt % solution of a three-component polyamic acid having the composition shown in Table 2. The tetracarboxylic dianhydride component and the diamine component were about 100 mol % stoichiometric.

The resulting polyamic acid solution was treated by the same method as in EXAMPLE 1, giving a polyimide blend film having a thickness of about 25 $\mu$m. The measured properties of the resulting polyimide interpenetrating film are shown in Table 2.

Comparative Example 6

This comparative example represents a 'random' polyimerization technique. A 2,000 cc glass flask was charged with 1,288 ml of dimethylacetamide, following which 198 g of 4,4'-diaminodiphenyl ether and 32.9 g of p-phenylenediamine were added to the dimethylacetamide. Next, 286.5 g of pyromellitic dianhydride was added, following which the flask contents were stirred at room temperature for about one hour, ultimately giving a 30 wt % solution of a three-component polyamic acid having the composition shown in Table 2. The tetracarboxylic dianhydride component and the diamine component were about 100 mol % stoichiometric.

The resulting polyamic acid solution was treated by the same method as in EXAMPLE 1, giving a polyimide blend film having a thickness of about 25 $\mu$m. The measured properties of the resulting polyimide interpenetrating film are shown in Table 2.

Comparative Example 7

8.65 g of PPD was charged into a 500 ml separable flask. Then, 70 g of DMAc were added to dissolve the PPD. The solution was stirred at from 5° to 10° C. in a dry nitrogen atmosphere.

Next, 17.45 g of PMDA were added in solid form to the PPD solution. The PMDA attached to the inner wall surface of the flask and was dissolved with an additional 10 g of DMAC. This solution was stirred for one hour, to thereby obtain a first polyamic acid solution.

In a separate flask, 32.038 g of 4,4-diaminodiphenyl ether (4,4-ODA) were charged. Next 285 g of DMAc was added to the same flask to the ODA. The solution was stirred at from 5° to 10° C. in a dry nitrogen atmosphere. Next, 23.993 g of PMDA and 14.610 g of BPDA was added to the ODA solution. The PMDA and BPDA attached to the inner wall surface of the flask and were dissolved with 10 g of DMAc. Thus a separate, second polyamic acid solution was formed.

Then, 53.05 g of the first polyamic acid polymer were added to the second polyamic acid polymer. The mixture was stirred for one hour to thereby obtain a blended polyamic acid polymer.

30 g of the blended polyamic acid polymer were mixed with 12.7 ml of DMAc, 3.6 ml of acetic anhydride and 3.6 ml of beta-picoline. The mixture was stirred to mix at −15° C. A portion of the polyamic acid with conversion chemicals was cast onto a glass plate to generate a uniform film. This film was then heated for 4 minutes at 150° C. to give a self-supporting blended polyamic acid-polyimide gel film. The gel film was heat for 20 minutes at 300° C. and then again for 5 minutes at 400° C. to obtain a blended polyimide film. The thickness of the resultant blended polyimide film was 37.5 micrometers. Results are shown in Table 3.

Comparative Example 8

The first polyamic acid was prepared in accordance with COMPARATIVE EXAMPLE 7. Regarding the second polyamic acid 32.038 g of 4,4'-ODA was dissolved in 285 g of DMAc. 23.993 g of PMDA and 14.610 g of BPDA were added in solid form to the ODA solution. The PMDA and BPDA were dissolved with an additional 10 g of DMAc. The components were allowed to polymerize over one hour to form a separate, second polyamic acid.

Then, 53.05 g of the first polyamic acid polymer was added to the second polyamic acid polymer. The mixture was stirred for one hour to thereby obtain a blended polyamic acid polymer. A portion of the blended polyamic acid polymer was aged at 30° C., in a dry nitrogen atmosphere for one day, to thereby obtain a blended, aged polyamic acid polymer.

30 g of the above prepared aged and non-aged polyamic acid polymers had added to them, 12.7 ml of DMAc, 3.6 ml of acetic anhydride and 3.6 ml of beta-picoline. The acids were stirred to mix at −15° C. and were cast in accordance with COMPARATIVE EXAMPLE 7. Results are shown in Table 3.

Comparative Example 9

A polyimide film was prepared in accordance with EXAMPLE 1 of U.S. Pat. No. 4,886,874. 4.33 g of PPD was charged into a flask along with 30 g of DMAc. The PPD dissolved and was stirred at from 5° to 10° C. in a dry nitrogen atmosphere. Meanwhile, 32.72 g of PMDA was added to a 100 ml-eggplant type flask. The PMDA attached to the inner wall surface of the 100-ml eggplant type flask and was dissolved with an additional 10 g of DMAc. The PMDA solution was poured into the PPD solution and the mixture was stirred for one hour to obtain a polyamic acid having acid anhydride group located at most of the end sites.

Then, 14.61 g of BPDA was added to a 100-ml eggplant type flask. The BPDA was added in solid form and again 10 g of DMAc was added to wet the vessel. The BPDA solution was poured into the polyamic acid and stirred for one hour. Next, 32.038 g of ODA was added to the polyamic acid solution along with 285 g of DMAc. The ODA was stirred for an hour at from 5° to 10° C. in a dry nitrogen atmosphere. A final block copolyamic acid was obtained.

30 g of the above prepared polyamic acid was mixed with, 12.7 ml of DMAc, 3.6 ml of acetic anhydride and 3.6 ml of beta-picoline. The reaction was stirred −15° C. A portion of the resultant polyamic acid with conversion chemicals was onto a glass plate to generate a uniform film. This film was heated over 4 minutes at 150° C. to give a self-supporting block copolyamic acid-polyimide gel film. The gel film was heat for 20 minutes at 300° C. and then for 5 minutes at 400° C. to obtain a block copolyimide. The thickness of the film was 37.5 micrometer. Results are shown in Table 3.

TABLE 1

Polyimide Interpenetrating Films

| | Polyamic acid C1 (components, mol %) | | Polyamic acid C2 (components, mol %) | | C1/C2 solids ratio (by weight) | Polymer solids (wt %) | Measurement/evaluation results | | | | | | |
|---|---|---|---|---|---|---|---|---|---|---|---|---|---|
| | | | | | | | Elastic modulus (GPa) | Thermal expansion coefficient (ppm/° C.) | Bonding strength (N/cm) | | Warping of metal laminate | Extrudability | Viscosity (Pa · s) |
| | Diamine A1 | Dianhydride B1 | Diamine A2 | Dianhydride B2 | | | | | Initial | After H₂O Treatment | | | |
| Example 1 | 3,4'ODA, 100 | PMDA, 100 | 3,4'ODA, 96 | PMDA, 100 | 9/1 | 30 | 5.1 | 16 | 14.7 | 14.7 | small | good | 980 |
| Example 2 | 4,4'ODA, 100 | PMDA, 100 | PPD, 96 | PMDA, 100 | 8/2 | 30 | 4.0 | 17 | 21.6 | 20.6 | small | good | 760 |
| Example 3 | 3A'ODA, 100 | PMDA, 100 | PPD, 96 | PMDA, 100 | 8/2 | 30 | 6.0 | 14 | 22.5 | 20.6 | small | good | 670 |
| Example 4 | 3,4'ODA, 100 | PMDA, 100 | PPD, 96 | BPDA, 100 | 8/2 | 30 | 5.9 | 15 | 19.6 | 19.6 | small | good | 880 |
| Example 5 | 3,4'ODA, 100 | PMDA, 100 | PPD, 96 | BPDA, 100 | 8/2 | 30 | 5.9 | 15 | 24.5 | 19.6 | small | | |
| Example 6 | 3,4'ODA, 100 | PMDA, 99.9 | PPD, 96 | BPDA, 100 | 8/2 | 30 | 5.9 | 16 | 19.6 | 19.6 | small | good | 650 |

TABLE 2

Polyimide Interpenetrating Films

| | Polyamic acid C1 (components, mol %) | | Polyamic acid C3 (components, mol %) | | C1/C3 solids ratio | Polymer solids (wt %) | Elastic modulus (GPa) | Thermal expansion coefficient (ppm/° C.) | Bonding strength (N/cm) | | Warping of metal laminate | Extrudability | Viscosity (Pa · s) |
|---|---|---|---|---|---|---|---|---|---|---|---|---|---|
| | Diamine A1 | Dianhydride B1 | Diamine A2 | Dianhydride B2 | (by weight) | | | | Initial | After H$_2$O Treatment | | | |
| Comp. Ex. 1 | 3,4'ODA, 100 | PMDA, 100 | | | | 30 | 4.2 | 20 | 9.8 | 9.8 | large | poor | >2000 |
| Comp. Ex. 2 | 3,4'ODA, 98 | PMDA, 100 | | | | 30 | | | | | | | 500 |
| Comp. Ex. 3 | 4,4'ODA, 100 | PMDA, 100 | PPD, 100 | PMDA, 100 | 8/2 | 30 | 3.8 | 15 | 9.8 | 9.8 | small | fair | 1800 |
| Comp. Ex. 4 | 4,4'ODA, 100 | PMDA, 100 | PPD, 100 | PMDA, 100 | 8/2 | 30 | 3.8 | 15 | 19.6 | 9.8 | small | fair | — |
| Comp. Ex. 5 | 4,4'ODA, 100 | PMDA, 99 | PPD, 96 | PMDA, 100 | 8/2 | 30 | 3.7 | 16 | 9.8 | 9.8 | small | fair | 1700 |
| Comp. Ex. 6 | 4,4'ODA, 80 | | PPD, 19.2 | PMDA, 99.2 | | 30 | 3.4 | 18 | 9.8 | 9.8 | small | fair | 1900 |

TABLE 3

Interpenetrating Polyimide films versus Blended Copolyimides

| | Film Property | Units | NON-AGED | AGED |
|---|---|---|---|---|
| Example 7 | Modulus | GPa | 4.9 | 4.2 |
| | Elongation | % | 64 | 65 |
| | CTE | ppm/C | 15 | 18 |
| | Warping of metal laminate | | small | small |
| | Haze | % | 1 | 1 |
| Example 8 | Modulus | GPa | 5.0 | 4.4 |
| | Elongation | % | 62 | 64 |
| | CTE | ppm/C | 14 | 17 |
| | Warping of metal laminate | | small | small |
| | Haze | % | 2 | 1 |
| Comparative Example 7 | Modulus | GPa | 4.8 | |
| | Elongation | % | 30 | |
| | CTE | ppm/C | 17 | |
| | Warping of metal laminate | | small | |
| | Haze | % | 10 | |
| Comparative Example 8 | Modulus | GPa | 4.7 | 3.8 |
| | Elongation | % | 66 | 67 |
| | CTE | ppm/C | 16 | 21 |
| | Warping of metal laminate | | small | large |
| | Haze | % | 1 | 1 |
| Comparative Example 9 | Modulus | GPa | 3.9 | |
| | Elongation | % | 68 | |
| | CTE | ppm/C | 20 | |
| | Warping of metal laminate | | large | |
| | Haze | % | 1 | |

We claim:

1. A polyimide film comprising:

(a) a first polyimide said first polyimide comprising the reaction product of components comprising a dianhydride component, a diamine component, and an end capping component, wherein said dianhydride component of said first polyimide has a tetravalent aromatic group selected from the group consisting of:

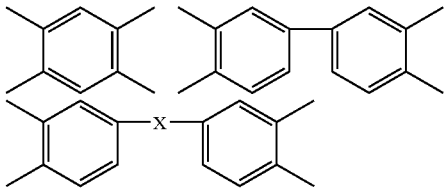

wherein X is a divalent organic group selected from among —CO—, —O—, —S—, —SO$_2$—, —CH$_2$—, —C(CH$_3$)$_2$—, and —C(CF$_3$)$_2$—;

wherein said diamine component of said first polyimide has a divalent aromatic group selected from the group consisting of:

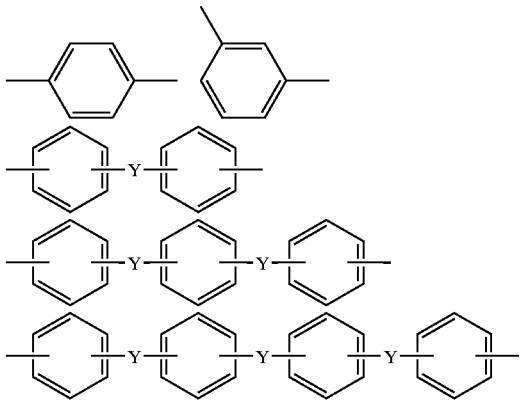

where in Y is a divalent organic group selected from the group consisting of —CO—, —O—, —S—, —SO$_2$—, —CH$_2$—, —C(CH$_3$)$_2$—, and —C(CF$_3$)$_2$—;

wherein said end capping component of said first polyimide is selected from the group consisting of: a carboxylic anhydride and a silylating agent, (b) a second polyimide said second polyimide comprising the reaction product of components comprising a dianhydride component, a diamine component, and an end capping component, wherein said dianhydride component of said second polyimide has a tetravalent aromatic group selected from the group consisting of:

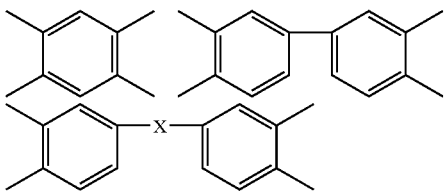

wherein X is a divalent organic group selected from among —CO—, —O—, —S—, —SO$_2$—, —CH$_2$—, —C(CH$_3$)$_2$—, and —C(CF$_3$)$_2$—;

wherein said diamine component of second polyimide has a divalent aromatic group selected from the group consisting of:

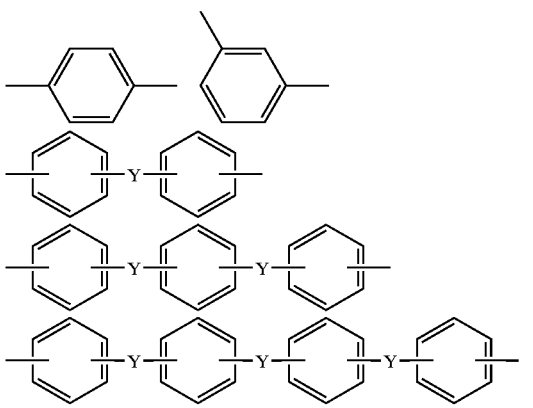

wherein Y is a divalent organic group selected from the group consisting of —CO—, —O—, —S—, —SO$_2$—, —CH$_2$—, —C(CH$_3$)$_2$—, and —C(CF$_3$)$_2$—;

wherein said end capping component of second polyimide is selected from the group consisting of: a carboxylic anhydride, and a silylating agent, wherein said first polyimide and said second polyimide are loosely, physically interlocked and bonded as an interpenetrating polyimide network, and wherein said first polyimide and said second polyimide are formed into a single film using a chemical conversion process.

2. An interpenetrating polyimide network comprising:

(a) a first polyimide said first polyimide comprising the reaction product of components comprising a dianhydride component, a diamine component, and an end capping component, said dianhydride component of said first polyimide selected from the group consisting of, pyromellitic dianhydride and biphenyltetracarboxylic dianhydride, said diamine component of said first polyimide selected from the group consisting of 3,4'-diaminodiphenyl ether, 4,4'-diaminodiphenyl either, and phenylene diamine, and said end capping component of said first polyimide selected from the group consisting of a carboxylic anhydride and a silylating agent, (b) a second polyimide said second polyimide comprising the reaction product of components comprising a dianhydride component, a diamine component, and an end capping component, said dianhydride component of said second polyimide selected from the group consisting of, pyromellitic dianhydride and biphenyltetracarboxylic dianhydride, said diamine component of said second polyimide selected from the group consisting of, 3,4'-diaminodiphenyl ether, 4,4'-diaminodiphenyl either, and phenylenediamine, and said end capping component of said second polyimide selected from the group consisting of a carboxylic anhydride and a silylating agent, wherein said first polyimide and said second polyimide are loosely, physically interlocked and bonded as an interpenetrating polyimide network, and wherein said first polyimide and said second polyimide are formed into a single film using a chemical conversion process.

3. The interpenetrating polyimide of claim 1 or claim 2 wherein:

i. the end capping component of the first polyimide; and ii. the end capping component of the second polyimide, is selected from the group consisting of phthalic anhydride and acetic anhydride.

4. The interpenetrating polyimide of claim 1 or claim 2 wherein the single film is formed using a thermal conversion process.

5. A method of manufacturing an interpenetrating polyimide film the method comprising the steps:

(a) reacting substantially equimolar amounts of a first diamine and a first dianhydride to form a first polyamic acid, (b) adding an end capping component to said first polyamic acid at a mole ratio of 0.001% to 2.0% with respect to the solids content of the total polymer, (c) adding substantially non-equimolar amounts of a second diamine and a second dianhydride to said first polyamic acid, (d) reacting the second diamine and the second dianhydride in the presence of the first polyamic acid to give a second polyamic acid thus formed in-situ, forming a physically, loosely interlocked and bonded interpenetrating polyamic acid network, (e) adding a catalyst agent to said interpenetrating polyamic acid network, (f) adding a dehydrating agent to said interpenetrating polyamic acid network, (g) casting or extruding the interpenetrating polyamic acid of step (f) onto a surface to form a interpenetrating polyamic acid-polyimide gel film, and (h) heating the interpenetrating polyamic acid-polyimide gel film to a temperature range of 200° to 500° C. to convert the interpenetrating polyamic acid-polyimide gel film into an interpenetrating polyimide film.

6. A method of manufacturing an interpenetrating polyimide film, the method comprising the steps:

(a) reacting substantially equimolar amounts of a first diamine and a first dianhydride to form a first polyamic acid, (b) adding an end capping component to said first polyamic acid at a mole ratio of 0.001% to 2.0% with respect to the solids content of the total polymer, (c) adding substantially equimolar amounts of a second diamine and a second dianhydride to said first polyamic acid, (d) reacting the second diamine and the second dianhydride in the presence of the first polyamic acid to give a second polyamic acid thus formed in-situ, forming a physically, loosely interlocked and bonded interpenetrating polyamic acid network, (e) adding a catalyst agent to said interpenetrating polyamic acid network, (f) adding a dehydrating agent to said interpenetrating polyamic acid network, (g) casting or extruding the interpenetrating polyamic acid of step (f) onto a surface to form a interpenetrating polyamic acid-polyimide gel film, and (h) heating the interpenetrating polyamic acid-polyimide gel film to a temperature range of 200° to 500° C. to convert the interpenetrating polyamic acid-polyimide gel film into an interpenetrating polyimide film.

7. The method of claim 5 or claim 6 wherein the first diamine and the second diamine is selected from the group consisting of phenylenediamine and diaminodiphenyl ether.

8. The method of claim 5 or claim 6 wherein the first dianhydride and the second dianhydride is selected from the group consisting of pyromellitic dianhydride and 3,3',4,4'-biphenyltetracarboxylic dianhydride.

9. The method of claim 5 or claim 6 wherein the first diamine is selected from the group consisting of 4,4'-diaminodiphenyl ether and 3,4'-diaminodiphenyl ether.

10. The method of claim 5 or claim 6 wherein the first diamine is selected from the group consisting of p-phenylene diamine.

11. The method of claim 5 or claim 6 wherein the second diamine is selected from the group consisting of 4,4,'-diaminodiphenyl ether and 3,4'-diaminodiphenyl ether.

12. The method of claim 5 or claim 6 wherein the second diamine is selected from the group consisting of p-phenylene diamine.

* * * * *

UNITED STATES PATENT AND TRADEMARK OFFICE
CERTIFICATE OF CORRECTION

PATENT NO.    : 6,828,390 B2
DATED         : December 7, 2004
INVENTOR(S)   : Uhara Kenji It is certified that error appears in the above-identified patent and that said Letters Patent is hereby corrected as shown below:

Column 8,
Line 15, "and 30 cm long. The strips were subjected to a 900 peel test" should read -- and 30 cm long. The strips were subjected to a 90° peel test --.

Column 10,
Line 49, "at from 50° 10° C." should read -- at from 5° to 10° C. --.
Line 57, "an additional log" should read -- an additional 10 g --.

Column 17,
Line 63, "ether, 4,4'-diaminodiphenyl either, and phenylene" should read -- ether, 4,4'-diaminodiphenyl ether, and phenylene --.

Column 18,
Line 11, "ether, 4,4'-diaminodiphenyl either, and phenylene" should read -- ether, 4,4'-diaminodiphenyl ether, and phenylene --.

Signed and Sealed this

Third Day of January, 2006

JON W. DUDAS
*Director of the United States Patent and Trademark Office*